United States Patent
Bergmann (10) Patent No.: US 8,536,929 B2
(45) Date of Patent: Sep. 17, 2013

(54) HIGH VOLTAGE SWITCH WITH ADJUSTABLE CURRENT

(75) Inventor: Thorald Horst Bergmann, Murnau (DE)

(73) Assignee: Bergmann Messgeräte Entwicklung KG, Murnau (DE)

( * ) Notice: Subject to any disclaimer, the term of this patent is extended or adjusted under 35 U.S.C. 154(b) by 16 days.

(21) Appl. No.: 13/190,681

(22) Filed: Jul. 26, 2011

(65) Prior Publication Data
US 2012/0002685 A1    Jan. 5, 2012

Related U.S. Application Data (60) Provisional application No. PCT/DE2010/075009, filed on Jan. 26, 2010.

(51) Int. Cl.
*H03K 17/687* (2006.01)
(52) U.S. Cl.
USPC .......................................... 327/427
(58) Field of Classification Search
USPC .......................................... 327/427
See application file for complete search history.

(56) References Cited

U.S. PATENT DOCUMENTS

| | | | |
|---|---|---|---|
| 3,910,679 A * | 10/1975 | Rushworth et al. | 359/264 |
| 4,503,480 A | 3/1985 | Pickard et al. | |
| 6,335,654 B1 * | 1/2002 | Cole | 327/546 |
| 7,061,201 B2 | 6/2006 | Goumain et al. | |
| 2004/0041201 A1 | 3/2004 | Sugiyama et al. | |
| 2005/0194919 A1 | 9/2005 | Xavier et al. | |
| 2005/0224909 A1 | 10/2005 | Yamaguchi et al. | |

FOREIGN PATENT DOCUMENTS

| | | |
|---|---|---|
| DE | 1762278 | 5/1968 |
| DE | 3630775 A1 | 3/1988 |
| DE | 195 15 279 C1 | 5/1996 |
| DE | 102007004391 B3 | 8/2008 |

OTHER PUBLICATIONS

International Search Report cited in related application No. PCT/DE2010/075009 dated Dec. 30, 2010.

* cited by examiner

*Primary Examiner* — Daniel Rojas
(74) *Attorney, Agent, or Firm* — Cooper Legal Group LLC (57) ABSTRACT

The present disclosure relates to a high voltage switch which may comprise a chain of MOS field-effect transistors (MOSFETs). The current of the individual MOSFETS, and hence the chain, can be controlled by means of adding a current measuring resistance into the source path of the transistors and transmitting the voltage arising there via a capacitor to a gate connector of the transistors.

13 Claims, 9 Drawing Sheets

HIGH VOLTAGE SWITCH WITH ADJUSTABLE CURRENT

RELATED APPLICATION

This application claims priority to German Patent Application No.: 10 2009 006 154.1, filed on Jan. 26, 2009, and PCT Application No.: PCT/DE2010/075009, filed on Jan. 26, 2010, respectively entitled "HIGH VOLTAGE SWITCH WITH ADJUSTABLE CURRENT", at least some of which may be incorporated herein.

BACKGROUND

For switching laser pulses, optical switches and/or modulators can be used and may be arranged either inside or outside a laser resonator in a beam path. Essentially, optical modulators may be differentiated between electro-optic modulators and acousto-optic modulators. A significant factor in the use of optical modulators is the achievable switching time. In acousto-optic modulators, the achievable switching time is generally defined by the sound velocity and the laser beam diameter. In some cases switching flanks of acousto-optic modulators are too slow to effectively suppress pre-pulses and/or post-pulses, for example, at a short distance from the main pulse. In comparison therewith, electro-optic modulators have been recently developed to achieve higher clock speeds. Thus, electro-optic modulators may be able to replace acousto-optic modulators in specific laser applications, as they are characterised by substantially shorter, electronically induced switching flanks.

Electro-optic modulators are generally designed so that they have a Pockels cell as an actual optical switching element with modifiable optical properties and a polarization-selective element, such as, for example, a reflecting analyser with unmodifiable optical properties. A Pockels cell generally has a birefringent crystal which is directed in an appropriate manner towards an incident monochromatic and polarized light beam and to which an electrical voltage is applied in the order of several 100 V up to several kilovolts. In combination with the polarization-dependent optical element, the Pockels cell is able to:

(a) switch on or switch off the light depending on the electrical voltage applied thereto, and/or
(b) to deflect the light on two different paths through an optical system.

The Pockels cell may be switched to-and-fro by a suitable switchable high voltage supply between two states in which the laser beam emerging from the Pockels cell (e.g., with polarization directions located perpendicular to one another) is polarized in a linear manner. The voltage that is required in order to achieve the two aforementioned states is a function of the crystal parameters and the wavelength of the light to be switched. Applications of Pockels cells exist in which the Pockels cells have to be switched on and off rapidly such that one or both of the transition times have to be in the range of a few nanoseconds. Where merely one of these transition times has to be short (e.g., either the switching-on or switching-off process), the other transition time may be in the range of microseconds.

Such an electro-optic modulator constructed from a Pockels cell and a suitable switchable high voltage supply may be used, for example, in order to switch optically short laser pulses having a duration of a few nanoseconds (ns) or ultra-short laser pulses having a duration of picoseconds (ps) and/ or femtoseconds (fs) (e.g., to alter the intensity or the beam direction of the laser pulses). Such ultra-short laser pulses may be generated by a mode-locking method known to those skilled in the art, for example. Thus laser beam sources for ultra-short pulses, in principle, have relatively high repetition rates (e.g., typically 40-200 MHz for solid state lasers) and low pulse energy (e.g., typically 0.1-50 nJ). If individual pulses or pulse groups of ps-laser pulses and/or fs-laser pulses are required, frequently a Pockels cell is used in order to select said pulses. In this case, initially the voltage has to be fully switched on between two pulses (e.g., which the laser beam source typically transmits at a time interval of 5-25 ns) in order to be fully switched off again after allowing a single laser pulse through 5-25 ns later.

In many applications, therefore, it is a case of achieving more rapid switching times. However, there are also situations in which it is advantageous if at least one of the two switching times is slower than might be possible by the switching element itself. A Pockels cell, for example, may be used inside a laser resonator in a manner known per se as a cavity dumper. In such an embodiment, it may be desirable to make the pulse, which is decoupled from the resonator by the cavity dumper, longer and to reduce the peak intensity. This may be achieved by extending the switching times of the control circuit of the Pockels cell. Accordingly, high voltage circuits may be required in which at least one of the switching flanks is made slower than the switching elements would normally permit.

SUMMARY

It is an object of the present disclosure to provide a switching unit which makes it possible to delay at least one switching flank.

Switching units or high voltage switches of the type described in this application are generally constructed as a transistor chain, arranged in series relative to their load paths. In particular, the switching units are typically provided by a chain made up of metal-oxide-semiconductor field-effect transistors (MOSFETs), which are arranged in series relative to their source/drain paths.

Figure 8:
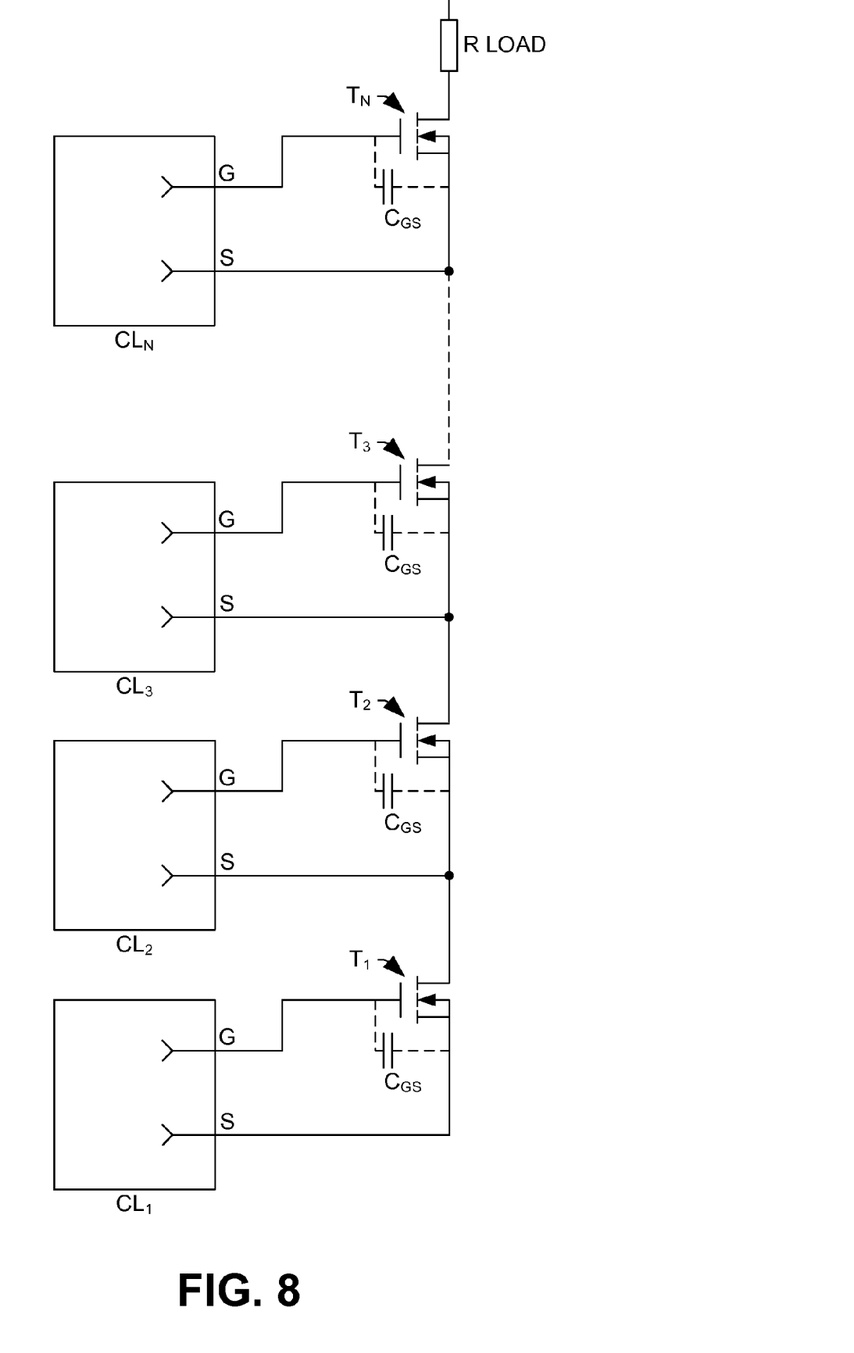
FIG. 8 illustrates an example schematic view of a switching unit.

The currents of the MOSFET switches and the switching flanks thereof are determined by internal impedances such as circuit inductors and/or transistor impedances of the design of the circuit, for example. In such MOSFET switches, in principle the switching flanks may be decelerated by one or more resistors, R_load, being introduced into the current path to the load, such as the Pockels cell. A drawback with such an arrangement, as shown in FIG. 8, however, would be the relatively high amount of power generated on the resistor (e.g., which would have to be cooled where possible and would require a relatively large amount of space).

The present disclosure therefore recognizes that it may be advantageous to control the current via the transistors themselves. To this end, a well-defined impedance may be introduced into the load path, on which a well-defined voltage drops, according to the current that flows therethrough. This voltage may be transmitted by means of a capacitor to the control electrode gate of the transistor.

The disclosure, therefore, relates to a switching unit comprising a plurality of transistors arranged in series relative to their load paths, at least one transistor with its load path being connected to a current measurement impedance, the current measurement impedance being connected to a capacitor, and the capacitor being connected to a control electrode of the transistor.

Otherwise, the transistor may be connected to a charging/ discharge circuit in a manner known to those skilled in the art. The capacitor may be charged and/or discharged by the arrangement at the same time with the gate source capacity of the MOSFET through the charging/discharge circuit. In this manner, power directly accumulates on the transistor where it may be easily discharged. Moreover, the current may not merely be controlled by the measurement impedance but also by the supplied voltage and/or charge from the charging/discharge circuit.

In one embodiment, a plurality of the transistors of the switching unit (e.g., preferably all transistors) are connected with their load path to a current measurement impedance, which in turn is connected to a capacitor. The capacitor may be connected to a control electrode of the transistor.

In one embodiment, the transistors are provided by field-effect transistors (e.g., such as MOS transistors), and the current measurement impedance is connected to the source of the transistor.

In one embodiment, the current measurement impedance has a real resistor.

In one embodiment, the control electrode of the transistor is connected to a charging/discharge circuit.

In one embodiment, a diode is arranged in parallel with the current measurement impedance.

The switching unit according to the present disclosure may be used in different ways for voltage switches, in particular high voltage switches.

A relatively simple arrangement comprises a so-called push-pull circuit comprising a circuit node, a first switching unit as provided herein with a first terminal connected to a first potential and with a second terminal connected to the circuit node, and a second switching unit as provided herein connected by a first terminal to the circuit node and by a second terminal to a second potential.

In such an embodiment, the first potential may be provided by a pole of a voltage source and the second potential may be provided by earth, for example. Similarly, the first potential may be provided by earth and the second potential may be provided by the other pole of the voltage source, for example.

Such a push-pull circuit may be designed as a Pockels cell control circuit, with a first terminal of a Pockels cell being connected to the circuit node and a second terminal of the Pockels cell being connected to a fixed potential.

A slightly more complex arrangement comprises a bridge circuit comprising a first circuit node and a second circuit node. The first circuit node may be connected by a first line to a first potential and by a second line, via a first switching unit as described herein, to a second potential. The second circuit node may be connected by a third line to the first potential and by a fourth line, via a second switching unit as described herein, to the second potential. At least one further switching unit as described herein may be connected to the first potential via one of the two circuit nodes.

Such a bridge circuit may be designed as a Pockels cell control circuit, with a first terminal of a Pockels cell being connected to the first circuit node and a second terminal of the Pockels cell being connected to the second circuit node.

A Pockels cell controlled as described above may thus be used as a cavity dumper inside a resonator of a laser beam source. By extending at least one of the switching flanks of the electrical switching pulses supplied to the Pockels cell, the laser pulse decoupled from the Pockels cell may be chronologically or timely extended and its peak intensity may be reduced, for example.

Those of ordinary skill in the art will appreciate still other aspects of the present application upon reading and understanding the appended description.

FIGURES

Exemplary embodiments are described in more detail hereinafter with reference to the drawings, in which.

DESCRIPTION

As used herein, "connected," "electrically connected," and/or "coupled" together when used to describe circuit elements can mean that the aforementioned elements are coupled directly together (e.g., without further elements located therebetween). However, unless otherwise stated, this can also mean that the aforementioned elements are not directly coupled together and that further elements may be coupled between the aforementioned elements.

Insofar as the same reference numerals are used in the figures, they relate to elements which are the same or substantially the same or functionally equivalent so that in these cases the description of these elements is not repeated.

Figure 1:
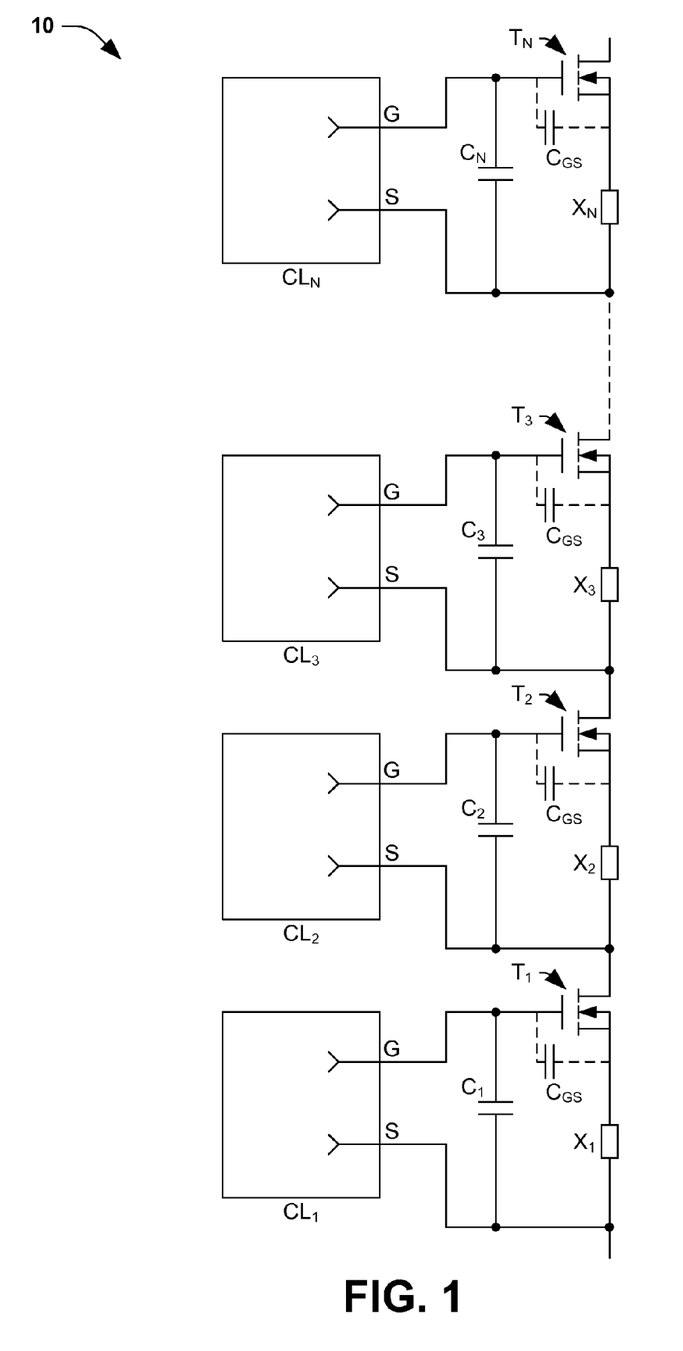
FIG. 1 illustrates an example schematic view of a switching unit.

FIG. 1 illustrates a schematic diagram of one embodiment of a switching unit 10. The switching unit 10 substantially comprises a transistor chain made up of N MOS field effect transistors (MOSFETs) (e.g., referred to in the figures as merely $T_N$), which are arranged in series relative to their source/drain paths, where N is a positive integer. The MOSFETs are switched on and/or off by known charging/discharge circuits $CL_N$, which are connected to a gate terminal and a source terminal of the MOSFETs. Such an arrangement can be configured as a high voltage switch. High voltage switches can switch voltages up to several kilovolts or several tens of kilovolts. The switching times of such high voltage circuits may be in the range of a few nanoseconds and may, for example, be controlled by TTL signals with a signal level of a few volts. The internal design of these high voltage switches, in particular the charging/discharge circuits $CL_N$, is, for example, disclosed in DE 3630775 C2, and thus does not need to be explained in more detail in the present case.

According to one embodiment of the instant disclosure, the source terminal of respective MOSFETs is connected to an impedance $X_N$. The impedance $X_N$ is connected to the gate terminal of the MOSFET via a capacitor $C_N$. The impedance $X_N$ has the function of a current measurement impedance. The voltage drop on the impedance $X_N$ may be transmitted via the capacitor $C_N$ to the gate terminal of the MOSFET. The capacitor $C_N$ is real in terms of circuit technology, whilst respective MOSFETs additionally have a merely virtual or parasitic (illustrated in dotted lines) gate source capacitor $C_{GS}$. The real capacitor $C_N$ and the parasitic capacitor $C_{GS}$ are also charged and/or discharged by the charging/discharge circuit $CL_N$.

The voltage drop on the impedance $X_N$ and the voltage representing the instantaneous value of the current flowing through the MOSFET is transmitted to the gate terminal of the MOSFET, and thus, in turn, controls the current through the MOSFET and the total current of the transistor chain. The current may, moreover, be controlled by the voltage and/or charge supplied by the charging/discharge circuit $CL_N$. A switching flank delivered by the charging/discharge circuit $CL_N$ to the MOSFET may be decelerated by the arrangement. Power may be directly applied to the MOSFETs and the impedances $X_N$, from where it may be relatively easily discharged.

The impedance $X_N$ may, in one embodiment, be provided by an individual real resistor $R_N$. The impedance $X_N$ may, however, also be provided by a combination of a resistor and a capacitor. Moreover, a combination of one or more resistors and/or capacitors and/or inductors and/or non-linear components is conceivable. It may also be provided that a combination of these components may have a controllable or adjustable impedance or resistance value. In this manner, the proportion of the voltage fed back to the gate may be set in a variable manner.

Figure 2:
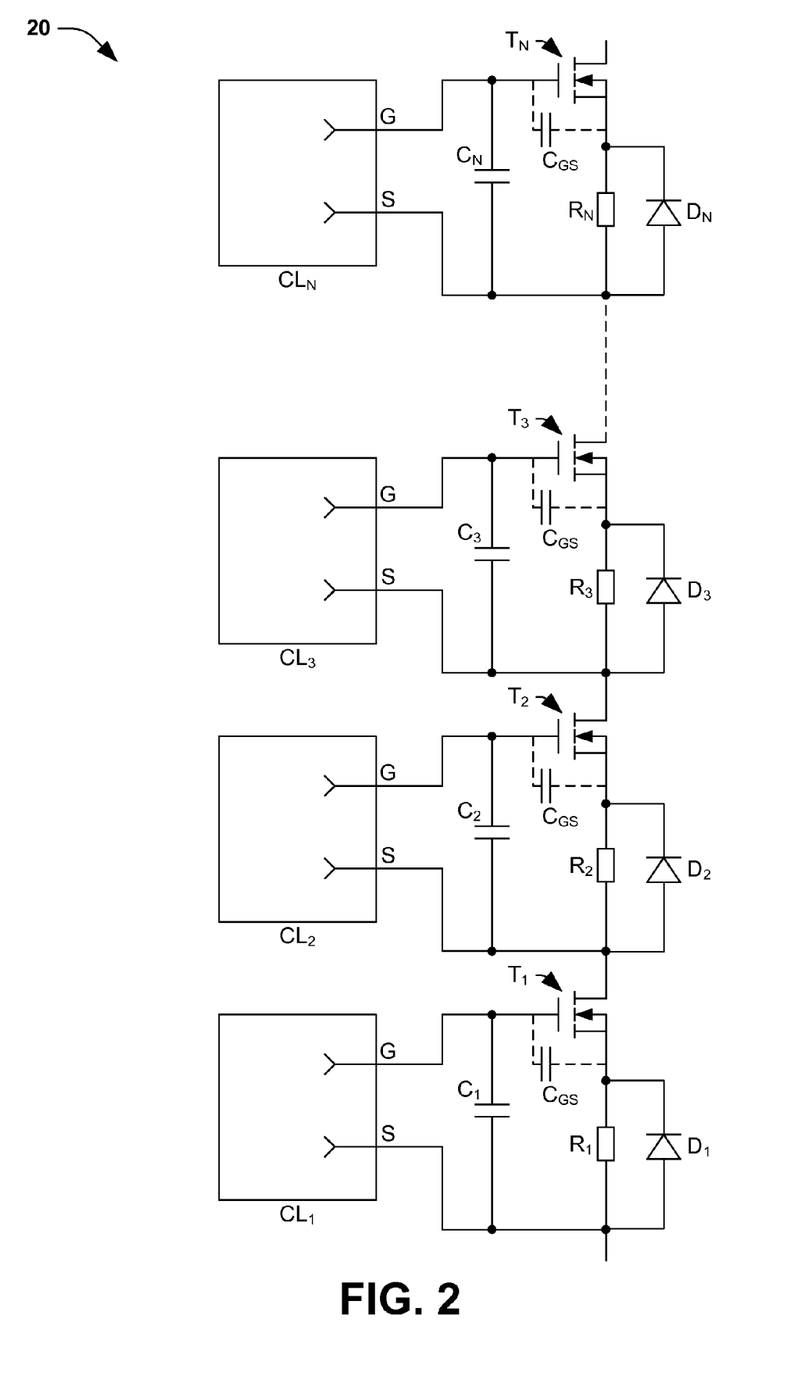
FIG. 2 illustrates an example schematic view of a switching unit.

FIG. 2 illustrates an example schematic of another embodiment of a switching unit 20, with the current measurement impedance having non-linear properties. This embodiment of a switching unit 20 is similar to the switching unit 10 illustrated in FIG. 1, except that the impedance $X_N$ shown in the embodiment of FIG. 1 is shown as a real resistor $R_N$ in FIG. 2. Additionally, in respective MOSFETs of the switching unit 20 with a diode $D_N$, a non-linear resistor is provided which is arranged in parallel with the impedance $X_N$. The diode $D_N$ may be arranged according to desired properties of current control in the non-conducting direction or conducting direction and may act as a current limiter for the current flowing in the parallel branch through the resistor $R_N$.

Figure 3:
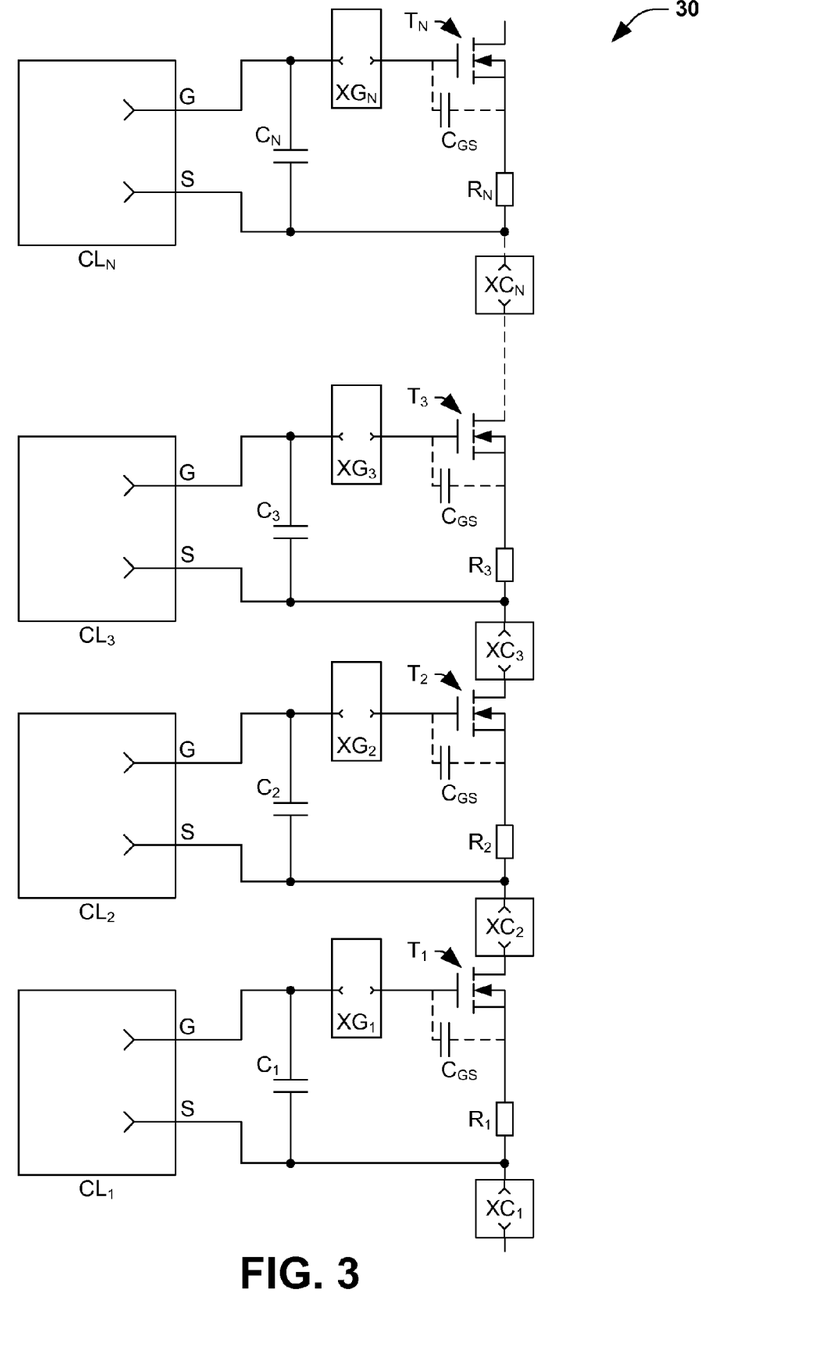
FIG. 3 illustrates an example schematic view of a switching unit.

FIG. 3 illustrates an example schematic of another embodiment of a switching unit 30. It will be appreciated that this embodiment of a switching unit 30 is similar to the switching unit 20 illustrated in FIG. 2, except that diodes $D_1$ to $D_N$ have been omitted. Additionally, in the switching unit 30, circuits $XC_N$ and/or $XG_N$ are inserted between adjacent MOSFETs of the transistor chain and/or in the gate lines of the transistors. Such circuits $XC_N$ and/or $XG_N$ may make it possible to effect further alterations to the temporal characteristics when switching the current, for example. In one embodiment, the circuits $XC_N$ and/or $XG_N$ may be a resistor or a resistor with a capacitor arranged in parallel and/or an inductor arranged in parallel. In order to effect non-linear properties, diodes or other non-linear components may also be used in these switching units.

Figure 4:
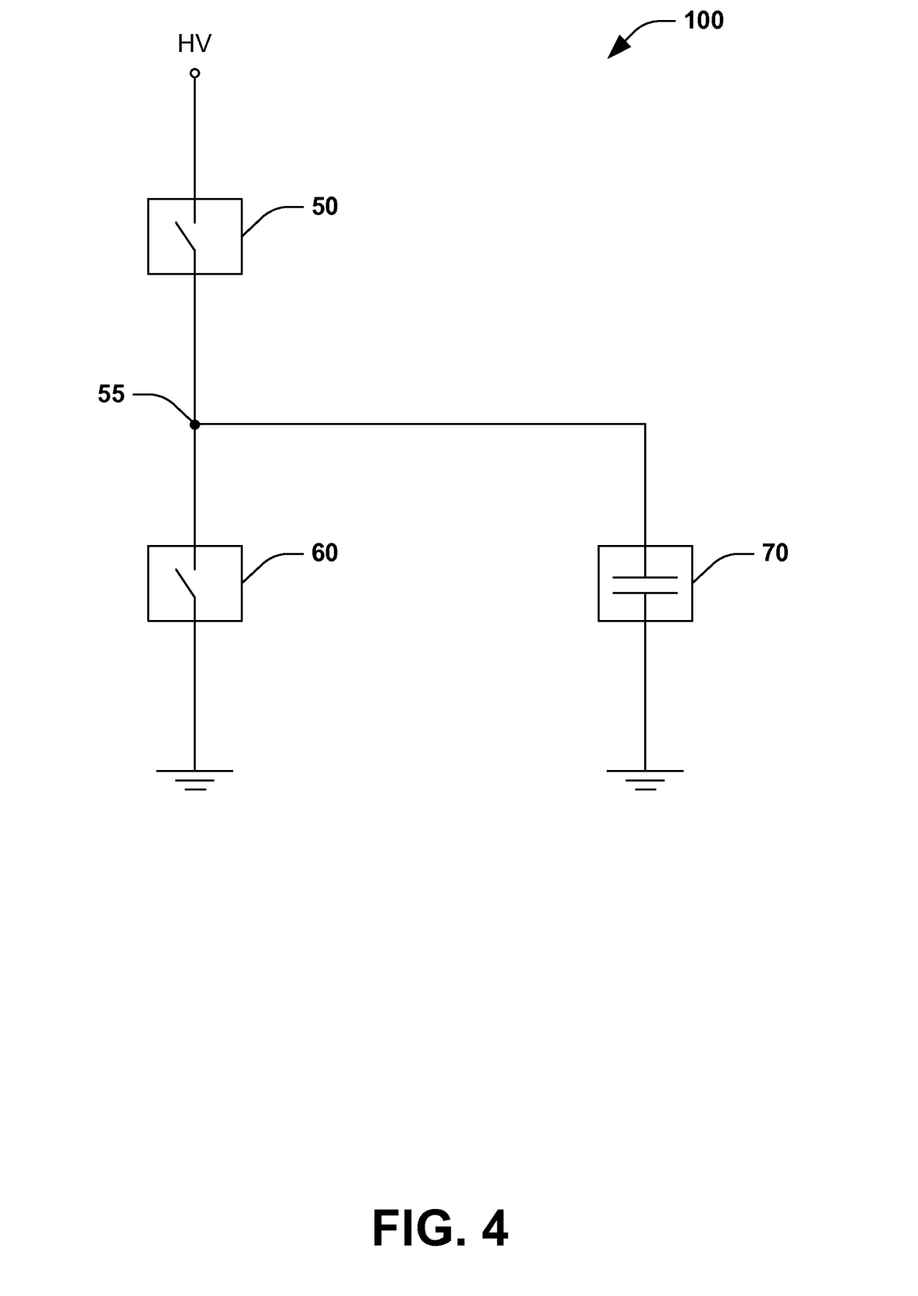
FIG. 4 illustrates an example schematic view of an embodiment of a push-pull circuit with switching units as set forth herein.

FIG. 4 illustrates an example schematic of one embodiment of a push-pull circuit with one or more of switching units 50, 60, such as the switching units 10, 20 and/or 30 described with respect to FIGS. 1-3. The push-pull circuit 100 has a first switching unit 50 and a second switching unit 60. The switching units 50 and 60 are arranged in series between a first potential terminal and a second potential terminal, the first potential terminal being able to be provided by a high voltage terminal (HV) and the second potential terminal by an earth terminal (e.g., ground).

The two switching units 50 and 60 are, for the sake of clarity, shown in block form. However, when shown schematically, they may resemble the schematics of one or more of the switching units 10, 20, and/or 30 shown in FIGS. 1-3 and described above.

The first switching unit 50 is connected by its first terminal to the high voltage terminal and by its second terminal to a circuit node 55. The second switching unit 60 is connected by its first terminal to the circuit node 55 and by its second terminal to the earth terminal. The circuit node 55 is, in turn, connected to a first terminal of a load 70, such as a Pockels cell. The second terminal of the load 70 is connected to the earth terminal.

The push-pull circuit 100 is operated so that a switching unit is closed, whilst the respective other switching unit is open. If the switching unit 60 is closed and the switching unit 50 is open, no voltage is applied to the load 70. In the reverse case, all or substantially all of the high voltage is applied to the load 70. Both switching units 50 and 60 may be provided by switching units as described herein with respect to FIGS. 1-3 or merely one of the switching units 50 and 60 may be provided by switching units as described herein with respect to FIGS. 1-3. This may depend on whether both switching flanks of the voltage pulse applied to the load 70 are intended to be delayed or merely one thereof, for example. If, for example, merely a rising flank of the voltage pulse is intended to be delayed, the switching unit 50 may be designed as set forth herein. If merely a falling flank of the voltage pulse is intended to be delayed, the switching unit 60 may be designed as set forth herein. If both switching flanks are intended to be delayed, both switching units 50 and 60 may be designed as set forth herein. A switching unit not designed as set forth herein may have a transistor chain as shown in FIG. 1 but with the impedance $X_N$ and the capacitor $C_N$ being omitted, for example.

It is also conceivable to design both switching units 50 and 60 as switching units as set forth in FIGS. 1-3, but to take care that delays provided by the switching units are modifiable, namely by variable impedances $X_N$ and/or variable capacitors $C_N$ or variable voltages of the charging units $CL_N$.

A further embodiment of a control circuit is provided by a bridge circuit which in terms of circuit technology is more complex than the push-pull circuit, but the drawbacks thereof when controlling a Pockels cell in terms of dynamic circuits may be able to be avoided, for example.

Figure 5:
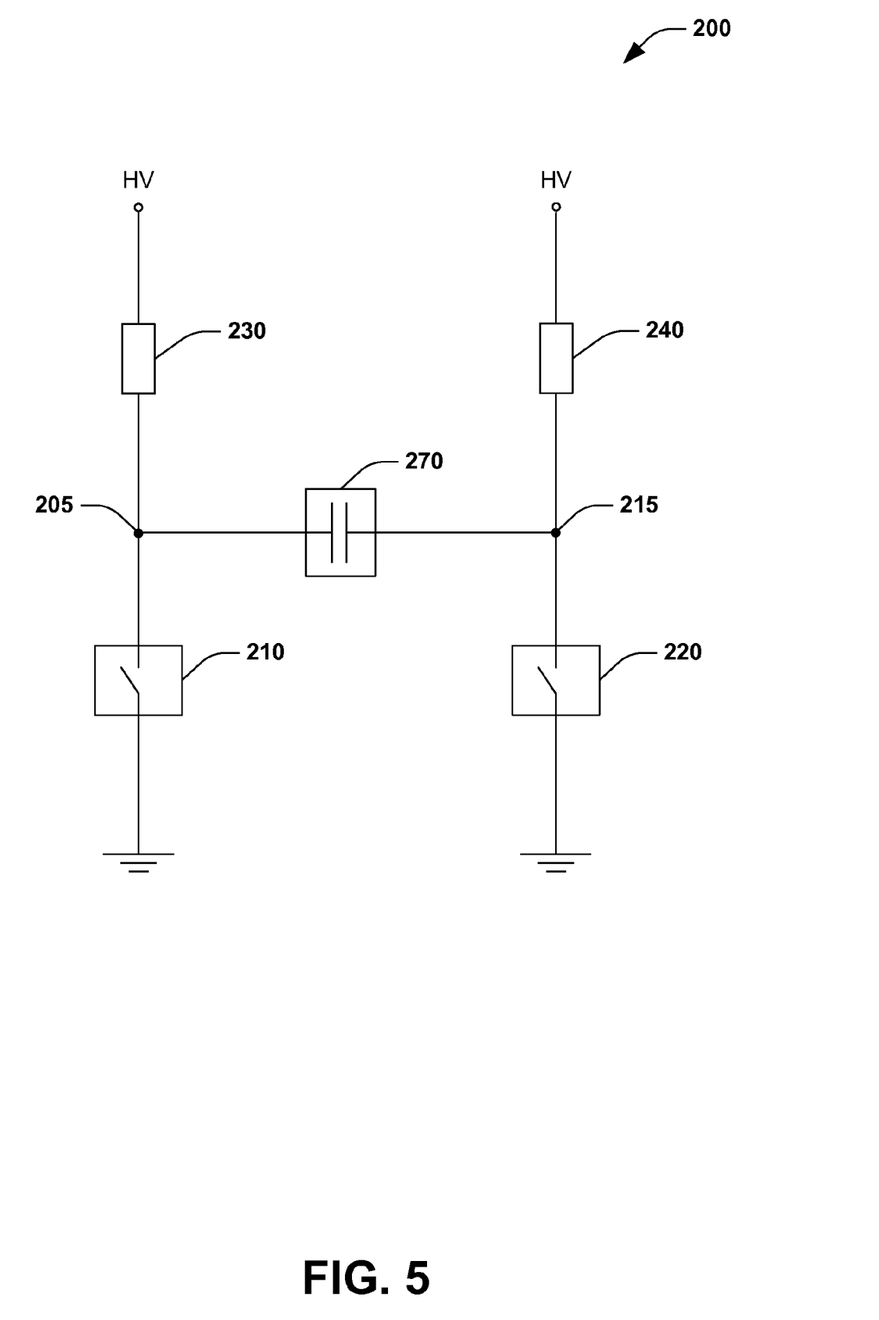
FIG. 5 illustrates an example schematic view of an embodiment of a bridge circuit comprising a switching unit as set forth herein.

FIG. 5 illustrates a schematic of an embodiment of a bridge circuit with switching units as set forth in the instant disclosure (e.g., such as with respect to FIGS. 1-3). The bridge circuit 200 comprises a so-called H-configuration. This H-configuration has two circuit nodes 205 and 215 which are to be attached to the electrical terminals of a load 270 such as a Pockels cell. The switching nodes 205 and 215 are the starting point of four lines which correspond to the four limbs of the letter H. The first circuit node 205 is connected by a first line via a first recharging resistor 230 to a first potential terminal such as a (high) voltage terminal HV and by a second line via a first switching unit 210 to a second potential terminal such as an earth terminal, whilst the second switching node 215 is connected by a third line via a second recharging resistor 240 to the first potential terminal and by a fourth line via a second switching unit 220 to the earth terminal.

The two switching units 210 and 220 are, for the sake of clarity, shown in block form and may be provided by switching units 10, 20, and/or 30, as shown in FIGS. 1-3, which have been described above. In this regard, the same applies as in the above-described push-pull circuit. The two switching units 210 and 220 are controlled in order to provide a voltage pulse to the load 270. If merely one switching flank of the voltage pulse is intended to be delayed, merely one of the switching units 210 and 220 may be designed as a switching unit as set forth herein. If both switching flanks are intended to be delayed, both switching units 210 and 220 may be designed as switching units as set forth herein.

Further embodiments of bridge circuits may be formed by at least one further switching unit as set forth herein being added, which is arranged in parallel with one or both of the recharging resistors 230, 240, and/or replaces one or both recharging resistors 230, 240.

Figure 6:
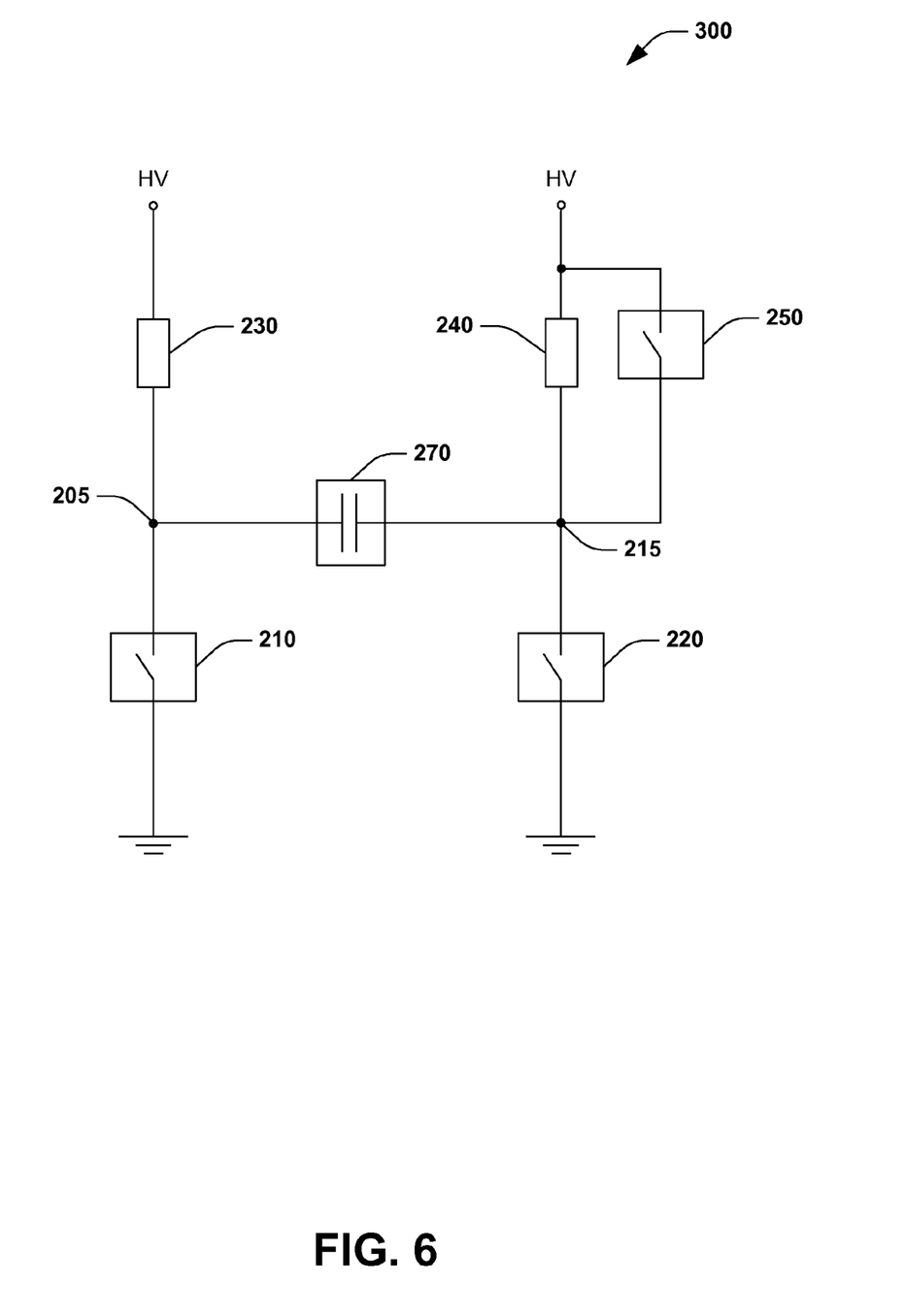
FIG. 6 illustrates an example schematic view of an embodiment of a bridge circuit comprising a switching unit as set forth herein.

Accordingly, in FIG. 6 a further embodiment of a bridge circuit with switching units as set forth herein is shown schematically. The bridge circuit 300 substantially corresponds to the bridge circuit 200 of FIG. 5, but moreover has a further switching unit 250 which is arranged between the two circuit nodes 215 and the high voltage terminal and thus is arranged in parallel with the second recharging resistor 240. The further switching unit 250 is shown in block form for the sake of clarity. It may be provided by a switching unit such as one of the switching units 10, 20, and/or 30 described with respect to FIGS. 1-3.

Figure 7:
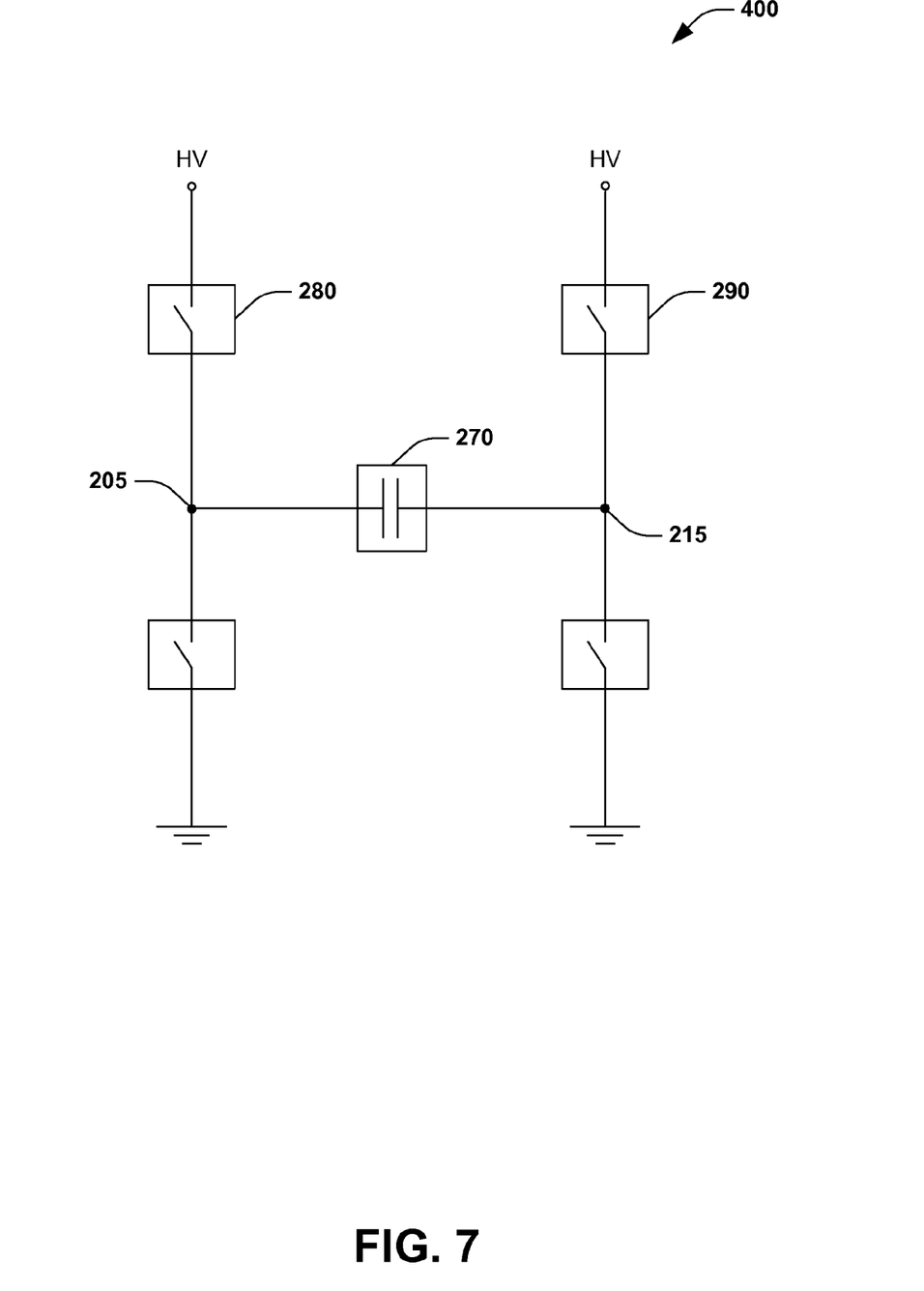
FIG. 7 illustrates an example schematic view of an embodiment of a bridge circuit comprising a switching unit as set forth herein.

In FIG. 7 a further embodiment of a bridge circuit with switching units as set forth herein shown schematically. The bridge circuit 400 substantially corresponds to the bridge circuit 200 of FIG. 5, but additionally has two further switching units 280 and 290, which replace the recharging resistors 230 and 240 of the bridge circuit of FIG. 5. The two further switching units 280 and 290 are, for the sake of clarity, shown in block form and may be provided by switching units as set forth herein, such as one or more of the switching units 10, 20, and/or 30 described with respect to FIGS. 1-3.

Figure 9:
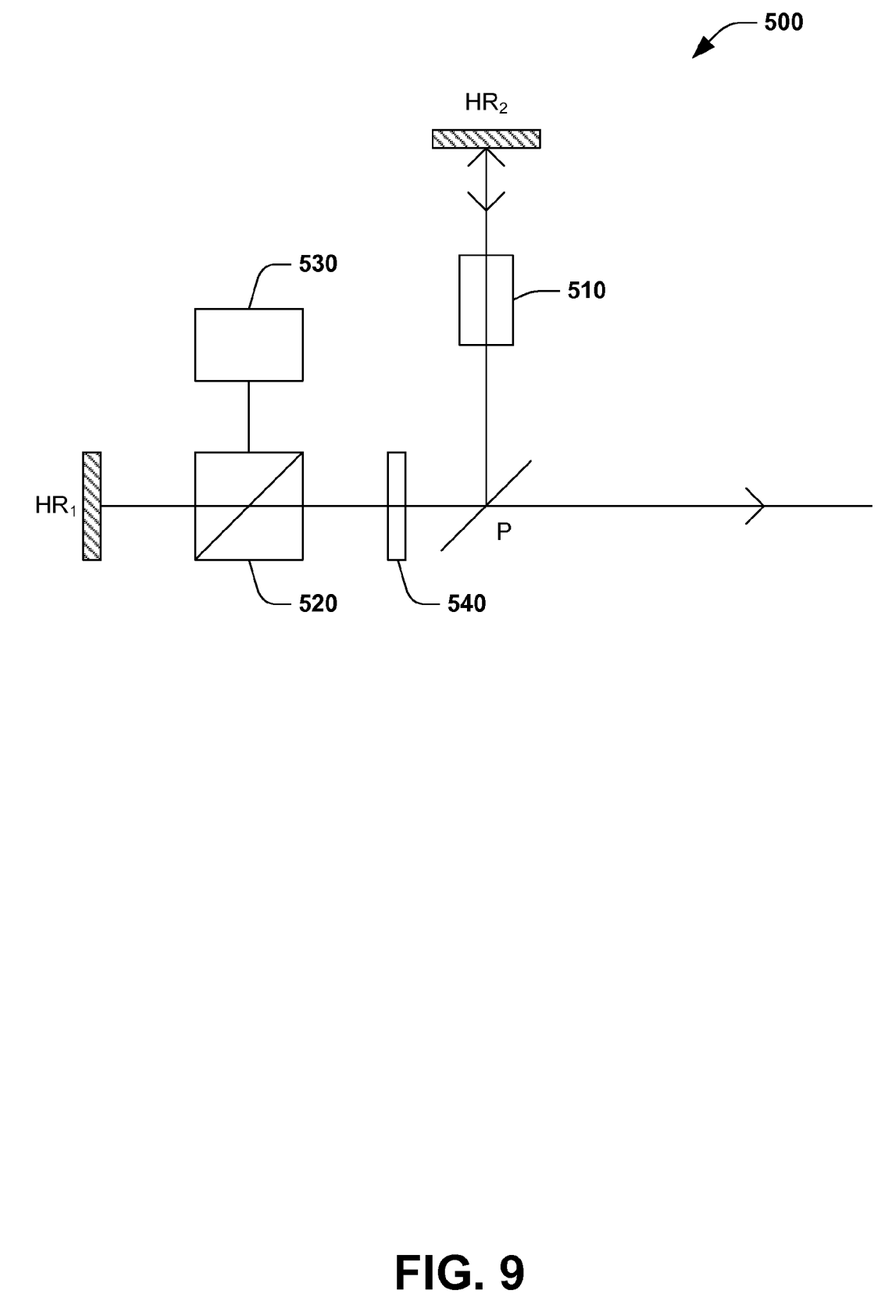
FIG. 9 illustrates an example schematic view of an embodiment of a laser beam source with a Pockels cell inside a resonator as a cavity dumper.

In FIG. 9, an embodiment of a laser beam source with a cavity dumper is shown schematically. The laser beam source 500 has a cw-resonator which is arranged between the (highly) reflective mirrors $HR_1$ and $HR_2$. A gain medium 510 is located inside the resonator. A Pockels cell 520 is arranged inside the resonator in relative proximity to the first (highly) reflective end mirror $HR_1$. A lambda/4 plate 540 is arranged in front of the Pockels cell 520. A polarization-dependent mirror P reflects, for example, s-polarized light completely, whilst it is completely permeable to p-polarized light. The Pockels cell 520 is connected to a control circuit 530 as set forth here, such as a push-pull circuit or a bridge circuit as described above.

Between two output pulses, no voltage may be applied to the Pockels cell 520, which is thus optically inactive, so that laser radiation coming from the gain medium 510 and which is, for example, s-polarized, is reflected on the mirror P and after passing twice through the Pockels cell 520, lambda/4 plate 540 and reflection on the HR1 is now p-polarized and decoupled from the mirror P. Thus no gain occurs when no voltage is applied to the Pockels cell 520. For generating the pulse, a voltage is applied to the Pockels cell 520, such that said Pockels cell when passed through twice, effects a rotation of the polarization by 90°, which together with the polarization rotation by the lambda/4 plate 540 adds up to 0° or 180°. In this state, the resonator is closed and the gain occurs on the gain medium 510. If the voltage is slowly removed from the Pockels cell 520e, the Pockels cell 520 together may act with the mirror P as a time-dependent decoupling. The control circuit 530 as set forth herein and connected to the Pockels cell 520 has the effect that at least one of the two switching flanks and/or the voltage pulse is extended, so that the laser pulse decoupled from the resonator obtains a desired chronological length and a correspondingly reduced peak intensity.

It should be noted that the features and elements described in the exemplary embodiments are also interchangeable between the exemplary embodiments as far as this is possible and expedient. Further exemplary embodiments may come within the scope of the invention, as defined by the following claims.

What is claimed is:

1. A switching unit, comprising:
a plurality of transistors arranged in series relative to their load paths, respective transistors of the plurality of transistors comprising a control electrode for controlling a current flow through the transistor, and wherein:
the load path of at least one transistor of the plurality of transistors being connected to a current measurement impedance,
the current measurement impedance being connected to a capacitor, and
the capacitor being connected to a control electrode of the at least one transistor.

2. The switching unit according to claim 1, the at least one transistor being a field effect transistor.

3. The switching unit according to claim 2, the current measurement impedance connected to a source of the at least one transistor.

4. The switching unit according to claim 1, the at least one transistor being a MOS field-effect transistor, and the current measurement impedance connected to a source of the at least one transistor.

5. The switching unit according to claim 1, the control electrode connected to a charging/discharge circuit.

6. The switching unit according to claim 1, the current measurement impedance comprising a real resistor.

7. The switching unit according to claim 1, the current measurement impedance comprising a diode.

8. The switching unit according to claim 1, comprising a switching circuit connected to the load path of the at least one transistor.

9. The switching unit according to claim 1, comprising a switching circuit connected to a gate line of the at least one transistor.

10. A push-pull circuit, comprising:
a circuit node;
a first switching unit comprising a first terminal connected to a first potential and a second terminal connected to the circuit node; and
a second switching unit comprising a first terminal connected to the circuit node and a second terminal connected to a second potential, at least one of the first switching unit or the second switching unit being provided by a switching unit according to claim 1.

11. A bridge circuit, comprising:
a first circuit node connected by a first line to a first potential and by a second line via a first switching unit to a second potential; and
a second circuit node connected by a third line to the first potential and by a fourth line via a second switching unit to the second potential, at least one of the first switching unit or the second switching unit being provided by a switching unit according to claim 1.

12. The bridge circuit according to claim 11, comprising at least one additional switching unit via which at least one of the first circuit node or the second circuit node are connected to the first potential.

13. The bridge circuit according to claim 12, the at least one additional switching unit being provided by a switching unit according to claim 1.

* * * * *